(12) United States Patent
Hagiwara et al.

(10) Patent No.: US 12,111,636 B2
(45) Date of Patent: Oct. 8, 2024

(54) TRANSPORT SYSTEM

(71) Applicant: Daifuku Co., Ltd., Osaka (JP)

(72) Inventors: Koichi Hagiwara, Komaki (JP); Makoto Kono, Komaki (JP)

(73) Assignee: Daifuku Co., Ltd., Osaka (JP)

(*) Notice: Subject to any disclaimer, the term of this patent is extended or adjusted under 35 U.S.C. 154(b) by 603 days.

(21) Appl. No.: 17/505,975

(22) Filed: Oct. 20, 2021

(65) Prior Publication Data
US 2022/0127079 A1 Apr. 28, 2022

(30) Foreign Application Priority Data
Oct. 22, 2020 (JP) ................. 2020-177321

(51) Int. Cl.
| | | |
|---|---|---|
| *G05B 19/418* | (2006.01) | |
| *B65G 1/04* | (2006.01) | |
| *B65G 43/08* | (2006.01) | |
| *H01L 21/67* | (2006.01) | |
| *H01L 21/677* | (2006.01) | |
| *B65G 1/137* | (2006.01) | |

(52) U.S. Cl.
CPC ......... *G05B 19/418* (2013.01); *B65G 1/0492* (2013.01); *B65G 43/08* (2013.01); *G05B 19/4189* (2013.01); *H01L 21/67276* (2013.01); *H01L 21/67724* (2013.01); *H01L 21/67727* (2013.01); *H01L 21/6773* (2013.01); *B65G 1/1375* (2013.01)

(58) Field of Classification Search
CPC .............. G05B 19/418; G05B 19/4189; B65G 1/0492; B65G 1/1375; B65G 43/08; B65G 1/1373; B65G 49/061; B65G 2201/0297; H01L 21/67276; H01L 21/67724; H01L 21/67727; H01L 21/6773
See application file for complete search history.

(56) References Cited

U.S. PATENT DOCUMENTS

| | | | | |
|---|---|---|---|---|
| 7,853,371 | B2 * | 12/2010 | Koide ................. | B65G 1/0421 414/807 |
| 9,519,284 | B2 * | 12/2016 | Wurman ............ | G05B 19/4189 |

(Continued)

FOREIGN PATENT DOCUMENTS

| | | |
|---|---|---|
| JP | 2003196780 A | 7/2003 |
| JP | 2007257154 A | 10/2007 |

(Continued)

*Primary Examiner* — Thomas Randazzo
(74) *Attorney, Agent, or Firm* — The Webb Law Firm

(57) ABSTRACT

In a case where the target article is transported between areas, a management control unit executes path setting control, a first area control unit executes first area transport control, a connection control unit executes connecting transport control, and a second area control unit executes second area transport control. With the path setting control, an overall path from a departure point to a destination point is set on the basis of transportation status information of a first area transport facility, a second area transport facility, and a plurality of connecting transport facilities. With the second area transport control, a partial path from a second transfer position of a target connecting transport facility to the destination point is set on the basis of transportation status information of the second area transport facility.

10 Claims, 4 Drawing Sheets

(56) References Cited

U.S. PATENT DOCUMENTS 9,740,212 B2\* 8/2017 D'Andrea ............ G05D 1/0212
2020/0115160 A1\* 4/2020 Maeda .............. H01L 21/67715
2023/0391592 A1\* 12/2023 High .................... G05D 1/0234

FOREIGN PATENT DOCUMENTS

| JP | 2009288976 A | 12/2009 |
| JP | 202030723 A | 2/2020 |
| WO | 2018225435 A1 | 12/2018 |

\* cited by examiner

TRANSPORT SYSTEM

CROSS-REFERENCE TO RELATED APPLICATION

This application claims priority to Japanese Patent Application No. 2020-177321 filed Oct. 22, 2020, the disclosure of which is hereby incorporated by reference in its entirety.

BACKGROUND OF THE INVENTION

1. Field of the Invention

The present invention relates to a transport system for transporting a plurality of transport articles.

2. Description of the Related Art

An example of such a transport system is described in JP 2003-196780 (Patent Document 1). The reference signs in brackets used in the description of the related art are those of Patent Document 1. In the transport system of Patent Document 1, a plurality of management devices (Tn) are configured to divide a transport path (L) into a plurality of regions (An) and perform management. As described in paragraphs [0033] to [0037] of Patent Document 1, each management device (Tn) stores, in a storage unit, information of the transport paths (L) received from other management devices (Tn) (i.e., information of transport paths (L) of regions (An) managed by other management devices (Tn)) in addition to information of the transport path (L) of the region (An) it manages and shares the information of the transport paths of all of the regions (An) with each management device (Tn). Then, when a search of the transport paths (L) is requested, the management device (Tn) references the information of the transport paths (L) stored in the storage unit, searches for a transport path from a starting point to an end point, and runs an unmanned transport vehicle (30) along the found transport path. Note that in paragraphs [0029] and [0041] of Patent Document 1, information of whether or not passage of the unmanned transport vehicle (30) is possible, traffic congestion information, and the like are given as examples of the information of the transport path (L).

SUMMARY OF THE INVENTION

In the transport system of Patent Document 1, the management devices share the information of the transport paths of all of the regions. Thus, the information of the transport paths of all of the regions can be taken into account when searching for a transport path that goes across a plurality of regions. However, in cases where the status of a transport path that may change over time due to whether or not a transport vehicle can pass, congestion, or the like, because the status of the transport path of the region may change before the article is transported in one of the regions (for example, the region closest to the endpoint), the found transport path may not be an appropriate path.

In regards to this, there is a demand for technology that enables the transport path of the target article in each area to be set appropriately in a case where the target article is transported between areas where operation control of the transport facility is executed by different control units.

A transport system according to the present disclosure is a transport system for transporting a plurality of transport articles, including:

a first area provided with a first area transport facility that forms a plurality of transport paths;

a first area control unit configured to control the first area transport facility and to transport the transport articles along a path selected from the plurality of transport paths in the first area;

a second area provided with a second area transport facility that forms a plurality of transport paths;

a second area control unit configured to control the second area transport facility and to transport the transport articles along a path selected from the plurality of transport paths in the second area;

a plurality of connecting transport facilities that each form a transport path connecting a first transfer position provided in the first area and a second transfer position provided in the second area;

a connection control unit configured to control the plurality of connecting transport facilities and to transport the transport articles between the first transfer position and the second transfer position; and a management control unit configured to manage the first area control unit, the second area control unit, and the connection control unit, wherein one transport article from among the plurality of transport articles is defined as a target article and others are defined as other articles;

in a case where the target article is transported between areas from a departure point in the first area to a destination point in the second area, the management control unit executes path setting control, the first area control unit executes first area transport control, the connection control unit executes connecting transport control, and the second area control unit executes second area transport control;

the path setting control is control that includes acquiring transportation status information indicating a transportation status of the other articles for each of the first area transport facility, the second area transport facility, and the plurality of connecting transport facilities, and setting an overall path from the departure point to the destination point on the basis of the transportation status information; a connecting transport facility from among the plurality of connecting transport facilities that is included in the overall path is defined as a target connecting transport facility;

the first area transport control is control in which the first area transport facility is operated to transport the target article from the departure point to the first transfer position of the target connecting transport facility;

the connecting transport control is control in which the target connecting transport facility is operated to transport the target article from the first transfer position of the target connecting transport facility to the second transfer position; and the second area transport control is control in which the second area transport facility is operated so that the transportation status information of the second area transport facility is acquired, a partial path from the second transfer position of the target connecting transport facility to the destination point is set on the basis of the transportation status information, and the target article is transported from the second transfer position of the target connecting transport facility to the destination point along the partial path.

According to the present configuration, in a case where the target article is transported between areas from the departure point in the first area to the destination point in the second area, the overall path from the departure point to the destination point can be set on the basis of the transportation status information of the first area transport facility, the second area transport facility, and the plurality of connecting transport facilities. In a different configuration where the transport path of the target article in the first area with the departure point is set without taking into account the transportation status information of the second area transport facility and/or the connecting transport facilities, even if the transport path of the target article in the first area is set appropriately, the overall path from the departure point to the destination point may not be set appropriately due to, for example, the transport path of the target article in the second area with the destination point going through a congested area (high traffic area), the entire length of the transport path from the departure point to the destination point being too long, using a connecting transport facility with many of the other articles waiting for transport, or the like. In contrast, in the present configuration, the overall path can be set taking into account the transportation status information of the first area transport facility, the second area transport facility, and the plurality of connecting transport facilities. This facilitates setting an appropriate path for the overall path.

In a case where a transportation status that changes over time due to congestion or the like is taken into account, the transportation status of the other articles in the transport facility provided in an area may change before the target article is transported in the area. Also, a change in the transportation status from when the overall path is set is likely to be more pronounced in the second area compared to the first area, because the target article is transported in the second area after. Regarding this, in the present configuration, with the second area transport control, the partial path to the destination point is set on the basis of the transportation status information of the second area transport facility, and the target article is transported along the partial path. Thus, even in a case where the transportation status of the other articles in the second area changes before the target article is transported in the second area, the transport path of the target article in the second area can be set more appropriately.

As described above, in the present configuration, in a case where the target article is transported between the first area and the second area where operation control of the transport facility is executed by different control units, the transport path of the target article in each area can be set appropriately.

Advantages and effects of the transport system will be made clear from the embodiments described below with reference to the drawings.

DETAILED DESCRIPTION OF PROFFERED EMBODIMENTS

Embodiments of a transport system will be described with reference to the drawings. A transport system 100 is a system for transporting a plurality of transport articles W (see FIG. 1). The transport system 100 is used in a transport facility (a facility for transporting the transport articles W) such as that illustrated in FIG. 1. The type of the transport article W is not limited, and the transport article W may be a front opening unified pod (FOUP) that houses a semiconductor wafer, for example.

Figure 1:
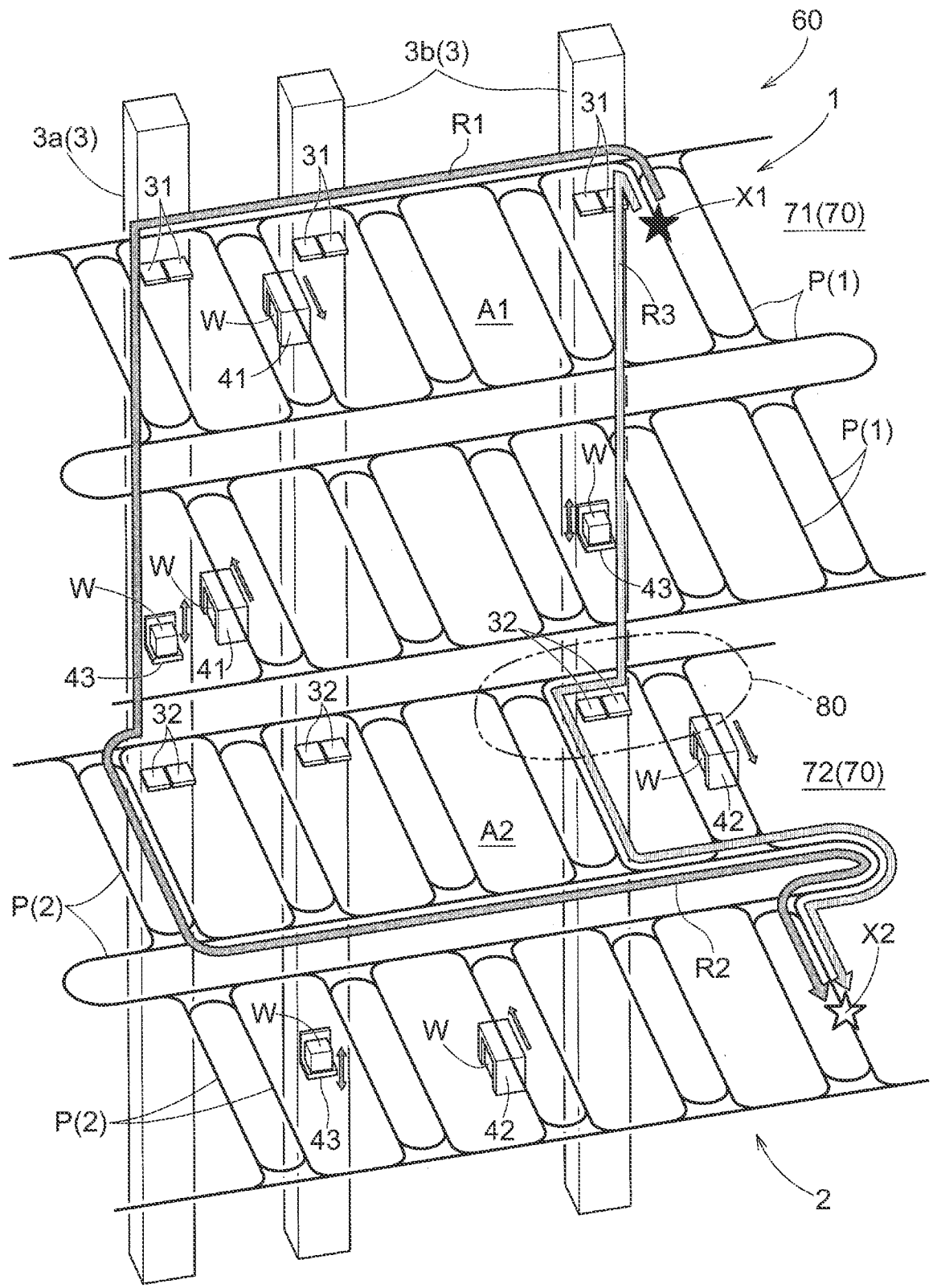
FIG. 1 is a perspective view illustrating in a simplified manner a transport facility according to an embodiment.

As illustrated in FIG. 1, the transport system 100 includes a first area A1 provided with a first area transport facility 1 forming a plurality of transport paths P, a second area A2 provided with a second area transport facility 2 forming a plurality of transport paths P, and a plurality of connecting transport facilities 3 forming the transport paths P (see FIG. 2) that connect first transfer positions 31 provided in the first area A1 and second transfer positions 32 provided in the second area A2. The first area A1 and the second area A2 are not directly connected. That is, the transport paths P in the first area A1 (the transport paths P formed by the first area transport facility 1) and the transport paths P in the second area A2 (the transport paths P formed by the second area transport facility 2) are not directly connected, and the transport paths P in the first area A1 and the transport paths P in the second area A2 are connected via the transport paths P formed by the connecting transport facilities 3. At the first transfer position 31, the transport article W is transferred between the first area transport facility 1 and the connecting transport facility 3, and, at the second transfer position 32, the transport article W is transferred between the second area transport facility 2 and the connecting transport facility 3. In this manner, to transfer the transport article W between the first area A1 and the second area A2, the transport article W needs to be transferred between different transport facilities. In the example illustrated in FIGS. 1 and 2, the transport system 100 includes three connecting transport facilities 3. The transport system 100 may include three or more areas provided with an area transport facility forming a plurality of transport paths P.

The first area transport facility 1, the second area transport facility 2, and the connecting transport facilities 3, for example, may be facilities for transporting the transport articles W via transport vehicles, facilities for transport the transport articles W via a belt conveyor or other conveyor, facilities for transporting the transport articles W via a lifter, facilities with a combination thereof, or any other form of transport facility. As illustrated in FIG. 1, in the present embodiment, the first area transport facility 1 is a facility for transporting the transport articles W via a first transport vehicle 41, and the second area transport facility 2 is a facility for transporting the transport articles W via a second transport vehicle 42. The first transport vehicle 41 and the second transport vehicle 42 travel while holding the transport articles W to transport the transport articles W. The transport paths P in the first area A1 are formed by travel paths of the first transport vehicle 41, and the transport paths P in the second area A2 are formed by travel paths of the second transport vehicle 42. The travel paths in the first area A1 and the travel paths in the second area A2 are not directly connected, and, in the present embodiment, the first transport vehicle 41 does not travel on the travel paths in the second area A2, and the second transport vehicle 42 does not travel on the travel paths in the first area A1. Note that in a case where the connecting transport facilities 3 are facilities for transporting the whole first transport vehicle 41 and second transport vehicle 42 (for example, a facility provided with a device for raising and lowering the transport vehicles), the transport vehicles may travel on the travel paths in the different area. The first transport vehicle 41 and the second transport vehicle 42, for example, are ceilingtravelling transport vehicles that travel along travel paths formed on the ceiling or floor-travelling transport vehicles that travel along travel paths formed on the floor. Note that the travel paths may be physical paths formed by rails or the like or may be virtual paths.

As illustrated in FIG. 1, in the present embodiment, the first area A1 and the second area A2 are separately set in the different floors 70 in the same building 60. The connecting transport facilities 3 are inter-floor transport facilities for transporting the transport articles W between the different floors 70 in the same building 60. In other words, in the present embodiment, the connecting transport facilities 3 are facilities for transporting the transport articles W via lifters. The lifter is provided with a lift body 43 that holds the transport article W and is raised and lowered and a mechanism for raising and lowering the lift body 43 (for example, a mechanism for raising and lowering the lift body 43 by winding up or letting out a belt). The transport path P connecting the first transfer position 31 and the second transfer position 32 is formed by the up and down path of the lift body 43.

In the present embodiment, at both the first transfer position 31 and the second transfer position 32, an inbound/outbound transport device, such as a conveyor, is provided that extends through a partition body forming the lift space of the lift body 43 therein (in other words, provided extending both inside and outside the partition body). The inbound/outbound transport device provided at the first transfer position 31 receives the transport article W from the first transport vehicle 41 outside the partition body, transports the transport article W from outside the partition body to inside, and passes the transport article W to the lift body 43. The inbound/outbound transport device provided at the second transfer position 32 receives the transport article W from the lift body 43 inside the partition body, transports the transport article W from inside the partition body to outside, and passes the transport article W to the second transport vehicle 42. The transfer of the transport article W between the transport vehicle, for example, the first transport vehicle 41 and the second transport vehicle 42, and the inbound/outbound transport device is performed by a transfer device provided on the transport vehicle, for example, and the transfer of the transport article W between the lift body 43 and the inbound/outbound transport device is performed by a transfer device provided on the lift body 43, for example.

As described below, the transport system 100 is advantageous in terms of the control performed when transporting a target article between areas from a departure point X1 in one area to a destination point X2 in another area. In the present specification, one of the plurality of transport article W is referred to as a "target article", and the others are referred to as "other articles". The target article is the transport article W to be transported between areas, and any of the transport articles W may correspond to the target article. The first area A1 described above is the area, of the plurality of areas in the transport system 100, where the departure point X1 is located, and the second area A2 described above is the area, of the plurality of areas in the transport system 100, where the destination point X2 is located. With the first area A1 and the second area A2 defined as such, one can understand that any one of the plurality of areas in the transport system 100 can be either the first area A1 or the second area A2.

In the example illustrated in FIG. 1, the building 60 includes the plurality of floors 70 including an upper floor 71 and a lower floor 72 (the floor 70 lower than the upper floor 71). In FIG. 1, a case where the transport article W is transported from the departure point X1 on the upper floor 71 to the destination point X2 on the lower floor 72 is envisioned. Thus, the area in the upper floor 71 corresponds to the first area A1, and the area in the lower floor 72 corresponds to the second area A2. In other words, the first area A1 is set in the upper floor 71, and the second area A2 is set in the lower floor 72. In a reversed case where the transport article W is transported from the departure point X1 on the lower floor 72 to the destination point X2 on the upper floor 71, the area in the lower floor 72 corresponds to the first area A1 and the area in the upper floor 71 corresponds to the second area A2.

Figure 2:
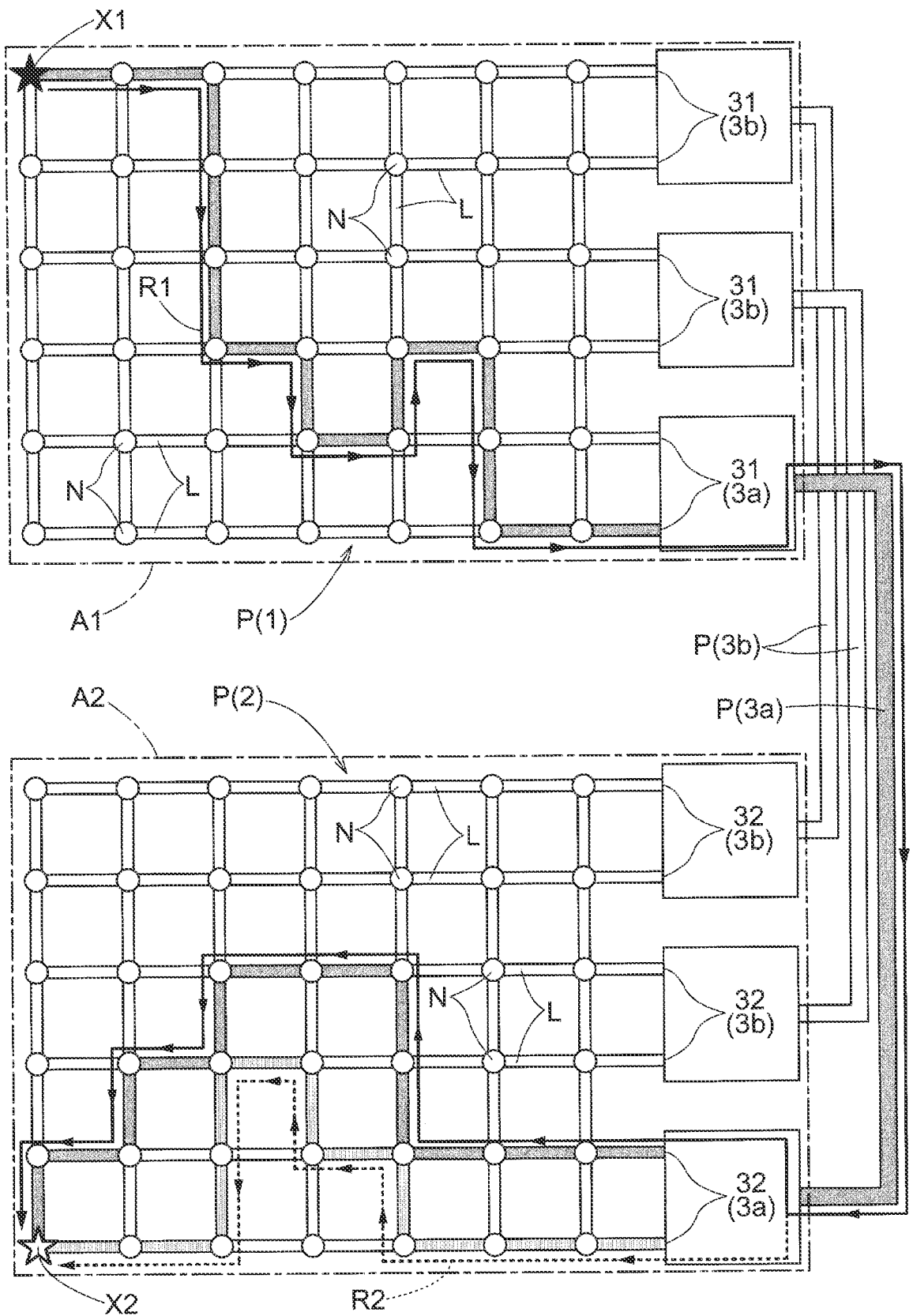
FIG. 2 is an explanatory diagram of an overall path and a partial path.

The plurality of transport paths P formed by the first area transport facility 1 and the second area transport facility 2 can be represented using nodes N and links L connecting the nodes N, as schematically illustrated in FIG. 2. The nodes N correspond to specific points, such as points where paths branch, points where paths merge, and the like, and the links L correspond to path portions that connect the specific points. In contrast to the first area transport facility 1 and the second area transport facility 2 that form the plurality of transport paths P, in the present embodiment as schematically illustrated in FIG. 2, the plurality of connecting transport facilities 3 (in the example illustrated in FIG. 2, there are three connecting transport facilities 3) each form a single transport path P that connects the first transfer position 31 and the second transfer position 32. Note that as described below, one of the plurality of connecting transport facilities 3 is referred to as a target connecting transport facility 3a, and the others are referred to as non-target connecting transport facilities 3b (see FIG. 1).

Figure 3:
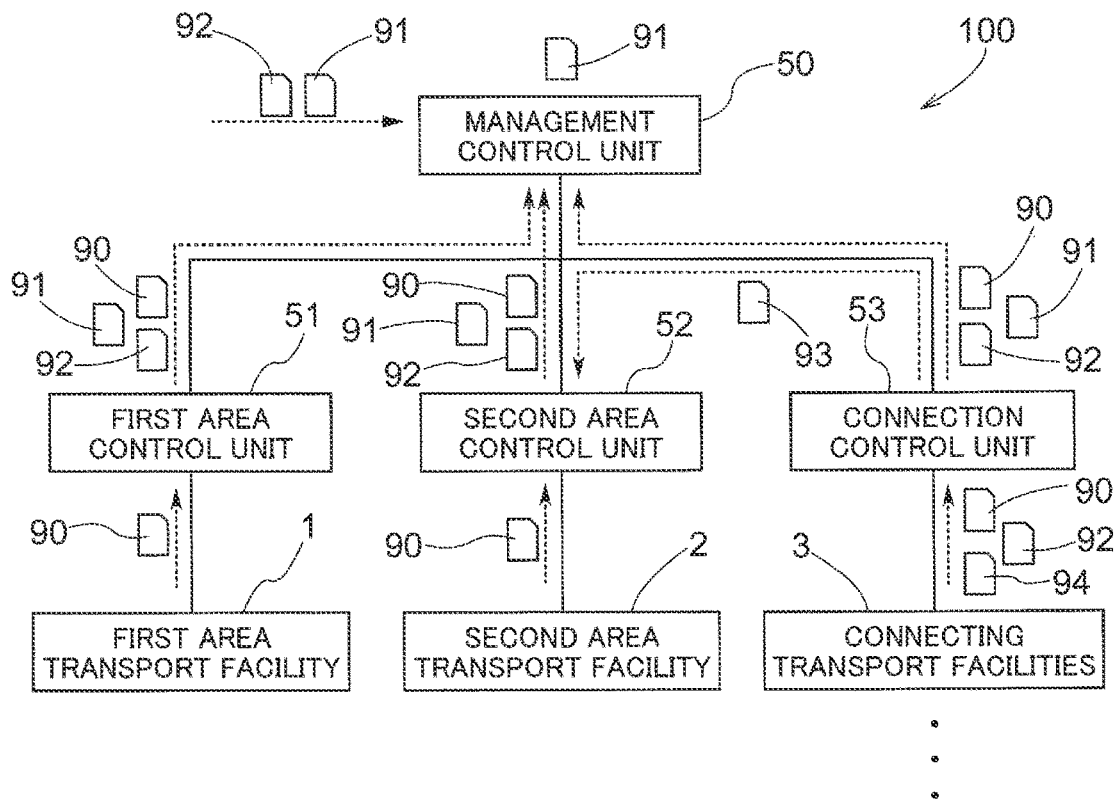
FIG. 3 is a control block diagram of the transport system.

As illustrated in FIG. 3, the transport system 100 is provided with a first area control unit 51, a second area control unit 52, a connection control unit 53, and a management control unit 50. The management control unit 50 manages the first area control unit 51, the second area control unit 52, and the connection control unit 53. These control units are configured to be capable of passing information between one another. Also, the function of each one of the plurality of control units is implemented via the cooperation of a hardware provided with an arithmetic processing unit and a storage unit and a program executed on the hardware. Note that the control units provided in the transport system 100 are at least logically separated, but there is no need for them to be physically separated. In other words, the plurality of control units may be provided in different pieces of hardware (for example, a computer provided with an arithmetic processing unit and a storage unit), or two or more of the control units may be provided in the same piece of hardware. For example, in a case where the first area control unit 51, the second area control unit 52, and the connection control unit 53 are provided in three separate pieces of hardware, the management control unit 50 may be provided in the same piece hardware as the first area control unit 51, or the management control unit 50 may be provided in a separate piece of hardware from the three pieces of hardware. The technology of the transport system 100 described in the present specification can be applied to a method of transporting the transport articles W, and a method of transporting the transport articles W is described in the present specification. This method of transporting includes an inter-area transportion process (specifically, a process including the processing (each step) illustrated in FIG. 4). Specifically, the method of transporting includes a process (step #01 of FIG. 4) of the management control unit 50 executing path setting control, a process (step #02 of FIG. 4) of the first area control unit 51 executing first area transport control, a process (step #03 of FIG. 4) of the connection control unit 53 executing connecting transport control, and a process (step #04 of FIG. 4) of the second area control unit 52 executing second area transport control.

The first area control unit 51 controls the first area transport facility 1 and transports the transport article W along the path selected from the plurality of transport paths P in the first area A1. In the present embodiment, the first area control unit 51 controls the first transport vehicle 41 of the first area transport facility 1 and causes the first transport vehicle 41 to travel while holding the transport article W so that the transport article W is transported along the selected path. Also, the second area control unit 52 controls the second area transport facility 2 and transports the transport article W along the path selected from the plurality of transport paths P in the second area A2. In the present embodiment, the second area control unit 52 controls the second transport vehicle 42 of the second area transport facility 2 and causes the second transport vehicle 42 to travel while holding the transport article W so that the transport article W is transported along the selected path.

The connection control unit 53 controls the plurality of connecting transport facilities 3 and transports the transport article W between the first transfer position 31 and the second transfer position 32. In the present embodiment, the connection control unit 53 controls the raising and lowering mechanism of the lift body 43 of the connecting transport facilities 3 and raises and lowers the lift body 43 while it holds the transport article W so that the transport article W is transported between the first transfer position 31 and the second transfer position 32. Note that the connection control unit 53 may be configured by one control unit that controls all of the connecting transport facilities 3 or may be configured by an assembly of control units (at least logically separated control units) that control different connecting transport facilities 3. In the case of the latter, the plurality of control units may be provided in different pieces of hardware, or two or more of the control units may be provided in the same piece of hardware. Also, the connection control unit 53 may be one control unit of the plurality of control units that control different connecting transport facilities 3.

Figure 4:
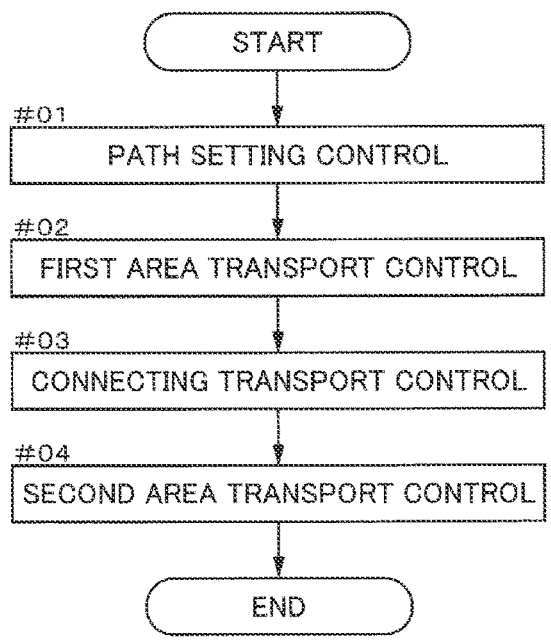
FIG. 4 is a control flowchart of inter-area transport.

In the transport system 100, in a case where the target article is transported between areas from the departure point X1 in the first area A1 to the destination point X2 in the second area A2, as illustrated in FIG. 4, the management control unit 50 executes path setting control (step #01), the first area control unit 51 executes first area transport control (step #02), the connection control unit 53 executes connecting transport control (step #03), and the second area control unit 52 executes second area transport control (step #04). Note that the departure point X1 (transportation starting point of the target article) and the destination point X2 (transportation destination of the target article), for example, may be load ports of processing devices that process the transport articles W (or the objects housed in the transport articles W) or storage shelves of storage devices that store the transport articles W.

The path setting control is control that includes acquiring transportation status information 90 indicating the transportation status of the other articles for each of the first area transport facility 1, the second area transport facility 2, and the plurality of connecting transport facilities 3 and setting the overall path R1 (see FIGS. 1 and 2) from the departure point X1 to the destination point X2 on the basis of the transportation status information 90. As illustrated in FIG. 3, the management control unit 50 acquires the transportation status information 90 of the first area transport facility 1 from the first area control unit 51, acquires the transportation status information 90 of the second area transport facility 2 from the second area control unit 52, and acquires the transportation status information 90 of the connecting transport facilities 3 from the connection control unit 53. The first area control unit 51, the second area control unit 52, and the connection control unit 53 each acquire information transmitted from the transport facility to be controlled (for example, information of the state of progress or completion of the transport article W transportation operation) as the transportation status information 90 of the transport facility and transmits the acquired transportation status information 90 to the management control unit 50.

In the present embodiment, the transportation status information 90 is information indicating the current transportation status of the other articles. Note that the transportation status information 90 may be information directly indicating the transportation status of the other articles (for example, information of the position of the other articles or information of whether or not the other articles are en route) or may be information indirectly indicating the transportation status of the other articles (for example, information of the congestion status of the transport paths P, information of the congestion status of the first transfer position 31 and the second transfer position 32, or information of the operation status of the transport facility). The information of the operation status of the transport facility, for example, may be information of the position of the transport bodies (in the present embodiment, the first transport vehicle 41, the second transport vehicle 42, and the lift body 43) transporting the transport articles W, information of whether or not the transport bodies have malfunctioned, or the like.

In the transport system 100, with the path setting control, the overall path R1 can be set on the basis of the transportation status information 90 of the first area transport facility 1, the second area transport facility 2, and the plurality of connecting transport facilities 3. This facilitates setting an appropriate path for the overall path R1. In order to explain this point with reference to FIG. 1, FIG. 1 illustrates a case where a congested area 80 where the transport path P is congested with other articles is present in the second area A2. In this state, for example, if a path, such as a comparative path R3, from the departure point X1 to the destination point X2 including the connecting transport facility 3 closest to the departure point X1 is set without taking into account the transportation status information 90 of the second area transport facility 2, the path will run through the congested area 80 in the second area A2, likely leading to the target article transportation time from the departure point X1 to the destination point X2 being extended.

Alternatively, in the transport system 100, because the overall path R1 is set taking into account the transportation status information 90 of the second area transport facility 2, a path, such as the overall path R1 illustrated in FIG. 1, from the departure point X1 to the destination point X2 that avoids the congested area 80 can be set. Also, for example, in a case where one of the connecting transport facilities 3 is congested at the first transfer position 31 or the second transfer position 32 with the other articles, the overall path R1 can be set taking into account the transportation status information 90 of this connecting transport facility 3. This allows a path from the departure point X1 to the destination point X2 that includes one of the other connecting transport facilities 3 to be set. In other words, by taking into account the transportation status information 90 of each one of the plurality of connecting transport facilities 3, the overall path R1 can be set to utilize the suitable connecting transport facility 3 from the perspective of improving target article transportation efficiency.

In the present embodiment, with the path setting control, the management control unit 50 is configured to further acquire weighting information 92 (see FIG. 3) indicating the weighting (weighting coefficient, cost) of each one of the transport paths P for each of the first area transport facility 1, the second area transport facility 2, and the plurality of connecting transport facilities 3 and set the overall path R1 on the basis of the weighting information 92. The weighting information 92 indicating the weighting of each one of the transport paths P is preset and stored in a storage device (a non-illustrated storage device provided in the management control unit 50, for example), and the management control unit 50 acquires the weighting information 92 of each one of the transport paths P referencing the storage device. Regarding the transport paths P formed by the first area transport facility 1 and the second area transport facility 2, weighting (link cost) is set for each link L. Also, weighting is set of the transport paths P formed by the connecting transport facilities 3 including the first transfer position 31 and the second transfer position 32. In the present embodiment, the connecting transport facilities 3 are provided with a plurality of the first transfer positions 31 (specifically, two first transfer positions 31) and a plurality of second transfer positions 32 (specifically, two second transfer positions 32), and the weighting of the transport paths P formed by the connecting transport facilities 3 may be set to different values depending on the combination of the first transfer position 31 and the second transfer position 32 that correspond to the transportation starting point and the transportation destination of the transport article W.

As illustrated in FIG. 3, in the present embodiment, the management control unit 50 is configured to be able to acquire the weighting information 92 of the transport paths P formed by the first area transport facility 1 from the first area control unit 51 and acquire the weighting information 92 of the transport paths P formed by the second area transport facility 2 from the second area control unit 52. The management control unit 50 may also be configured to be able to acquire the weighting information 92 of the transport paths P formed by the connecting transport facilities 3 from the connection control unit 53.

The weighting of the transport paths P, for example, may be set taking into account the length of the transport paths P (the length of the path portions corresponding to the links L for the transport paths P formed by the first area transport facility 1 and the second area transport facility 2), the average required transportation time for the transport paths P obtained via learning based on previous transportation status information 90, average congestion rate for the transport paths P obtained via learning based on previous transportation status information 90, or a combination thereof. In a case where the weighting is set taking into account the length of the transport paths P, the greater the length of the transport paths P, the greater the weighting. In a case where the weighting is set taking into account the average required transportation time of the transport paths P, the greater the required transportation time, the greater the weighting. In a case where the weighting is set taking into account the average congestion rate of the transport paths P, the greater the congestion rate, the greater the weighting. Note that weighting of the transport paths P may be set on the basis of information obtained via learning for only a portion of the transport facilities (for example, the first area transport facility 1 and the second area transport facility 2) or all of the transport facilities, from among the first area transport facility 1, the second area transport facility 2, and the plurality of connecting transport facilities 3.

In a case where a conveyor with a length that allows a plurality of the transport articles W to be placed side by side in the transport direction is provided at the first transfer position 31 and the second transfer position 32, the weighting of the transport paths P formed by the connecting transport facilities 3 may be changed depending on the quantity of the transport articles W held up at the first transfer position 31 and/or the second transfer position 32. Regarding this, the weighting of the transport paths P formed by the connecting transport facilities 3 may be set taking into account the quantity of the transport articles W held up at the first transfer position 31 and/or the second transfer position 32. At the first transfer position 31 and the second transfer position 32, a maximum quantity, corresponding to a buffer number (maximum holding number) of the transfer position, of the transport articles W can be held. Thus, for example, the weighting of the transport paths P formed by the connecting transport facilities 3 can be set so that the greater the buffer number of the first transfer position 31 and the second transfer position 32, the greater the weighting.

In the present embodiment, with the path setting control, the management control unit 50 is configured to set, as the overall path R1, a path with the lowest estimated value for the time required to transport the target article from the departure point X1 to the destination point X2. As the path with the lowest estimated value for the time required, for example, the path with the lowest path cost can be set from among candidate paths from the departure point X1 to the destination point X2. The path with the lowest path cost can be found using Dijkstra's algorithm, for example. Here, the path cost is a cost indicating an estimated value of the time required to transport the target article from the departure point X1 to the destination point X2. The path cost may be obtained by adding together the weightings set for all of the transport paths P included in the candidate path. Here, by correcting the weighting of the transport paths P on the basis of the transportation status information 90, the transportation status of the first area transport facility 1, the second area transport facility 2, and the plurality of connecting transport facilities 3 can be reflected in the path cost, and the overall path R1 can be set.

In the present embodiment, with the path setting control, the management control unit 50 is configured to further acquire estimated transportation status information 91 (see FIG. 3) indicating the future transportation status of the other articles estimated on the basis of previous transportation status information 90 for each of the first area transport facility 1, the second area transport facility 2, and the plurality of connecting transport facilities 3 and set the overall path R1 also on the basis of the estimated transportation status information 91. The estimated transportation status information 91, for example, may be the same type of information as the transportation status information 90 (differing, however, in that the transportation status is a future transportation status of the other articles and not the current transportation status of the other articles). In a case where the estimated transportation status information 91 is generated by the management control unit 50, the management control unit 50 acquires the estimated transportation status information 91 it generated itself. The estimated transportation status information 91 may be generated on the basis of the transport paths (paths from the transportation starting point to the transportation destination) set for the other articles in addition to the previous transportation status information 90 (for example, the transportation status information 90 up until this time). As described above, in the present embodiment, the path with the lowest path cost is set as the overall path R1. Thus, by correcting the weighting of the transport paths P on the basis of the estimated transportation status information 91, the estimated future transportation status of the first area transport facility 1, the second area transport facility 2, and the plurality of connecting transport facilities 3 can be reflected in the path cost, and the overall path R1 can be set.

Note that the management control unit 50 may have a configuration in which, instead of the estimated transportation status information 91 for each of the first area transport facility 1, the second area transport facility 2, and the connecting transport facilities 3 being calculated and acquired by itself, the management control unit 50 acquires the estimated transportation status information 91 for the first area transport facility 1 from the first area control unit 51, acquires the estimated transportation status information 91 for the second area transport facility 2 from the second area control unit 52, and acquires the estimated transportation status information 91 for the connecting transport facilities 3 from the connection control unit 53. In this case, the estimated transportation status information 91 for the first area transport facility 1 is calculated by the first area control unit 51 and transmitted to the management control unit 50, the estimated transportation status information 91 for the second area transport facility 2 is calculated by the second area control unit 52 and transmitted to the management control unit 50, and the estimated transportation status information 91 for the connecting transport facilities 3 is calculated by the connection control unit 53 and transmitted to the management control unit 50.

As illustrated in FIG. 4, after the management control unit 50 executes the path setting control, the first area control unit 51 executes the first area transport control. Here, the connecting transport facility 3, from among the plurality of connecting transport facilities 3, that is included in the overall path R1 is defined as the target connecting transport facility 3a, and the others are defined as the non-target connecting transport facilities 3b. The first area transport control is control in which the first area transport facility 1 is operated to transport the target article from the departure point X1 to the first transfer position 31 of the target connecting transport facility 3a. In the present embodiment, with the first area transport control, control is executed to cause the first transport vehicle 41 to travel while holding the target article so that the target article is transported from the departure point X1 to the first transfer position 31 of the target connecting transport facility 3a. Also, in the present embodiment, each one of the plurality of connecting transport facilities 3 is provided with a plurality of the first transfer positions 31, and the target article is transported to the first transfer position 31, from among the plurality of first transfer positions 31, that is included in the overall path R1.

In the present embodiment, with the first area transport control, the first area transport facility 1 is operated to transport the target article from the departure point X1 to the first transfer position 31 of the target connecting transport facility 3a along the overall path R1. In another possible configuration, with the first area transport control, the first area transport facility 1 is operated so that the first area control unit 51 acquires the transportation status information 90 for the first area transport facility 1, sets the path (hereinafter, referred to as the "re-set path") from the departure point X1 to the first transfer position 31 of the target connecting transport facility 3a on the basis of the transportation status information 90, and transports the target article from the departure point X1 to the first transfer position 31 of the target connecting transport facility 3a along the re-set path. The re-set path may be set in a similar manner to the overall path R1, except excluding taking into account the information (specifically, the transportation status information 90, the estimated transportation status information 91, and the weighting information 92) of the second area transport facility 2 and the connecting transport facilities 3.

There are cases where the re-set path is set on the same path as the portion of the overall path R1 from the departure point X1 to the first transfer position 31 of the target connecting transport facility 3a and cases where the re-set path is set on a path with at least a portion different, and even in the latter case, the re-set path is set including the target connecting transport facility 3a. In the present embodiment, each one of the plurality of connecting transport facilities 3 is provided with a plurality of the first transfer positions 31. The configuration in this case may allow the re-set path to be set including the first transfer position 31 different from the first transfer position 31 included in the overall path R1 and may not allow this. In the former case, the first area control unit 51 acquires the information indicating the inbound/outbound transport status of the other articles for each one of the plurality of first transfer positions 31 of the target connecting transport facility 3a from the target connecting transport facility 3a and, on the basis of this information, select the transportation destination of the target article for the first area transport control from the plurality of first transfer positions 31.

As illustrated in FIG. 4, after the first area control unit 51 executes the first area transport control, the connection control unit 53 executes the connecting transport control. The connecting transport control is control in which the target connecting transport facility 3a is operated to transport the target article from the first transfer position 31 of the target connecting transport facility 3a to the second transfer position 32 (the second transfer position 32 of the target connecting transport facility 3a). In the present embodiment, with the connecting transport control, control is executed to raise and lower the lift body 43 while the lift body 43 is holding the target article to transport the target article from the first transfer position 31 to the second transfer position 32.

In the present embodiment, each one of the plurality of connecting transport facilities 3 is provided with a plurality of the second transfer positions 32. Also, in the present embodiment, the connection control unit 53 is configured to acquire inbound/outbound transport status information 94 (see FIG. 3) indicating the inbound/outbound transport status of the other articles for each one of the plurality of second transfer positions 32 of the target connecting transport facility 3a and, on the basis of the inbound/outbound transport status information 94, select the transportation destination of the target article for the connecting transport control from the plurality of second transfer positions 32. The connection control unit 53 acquires the inbound/outbound transport status information 94 from the target connecting transport facility 3a. For example, the connection control unit 53 is configured to be able to select, as the transportation destination of the target article for the connecting transport control, the second transfer position 32, from among the plurality of second transfer positions 32, with the lowest placement number of the other articles. In a case where the second transfer position 32 selected by the connection control unit 53 is not one of the second transfer positions 32 included in the overall path R1, a partial path R2 described below is set as a path with at least a portion that is different from the portion of the overall path R1 between the second transfer position 32 and the destination point X2.

As illustrated in FIG. 4, after the connection control unit 53 executes the connecting transport control, the second area control unit 52 executes the second area transport control. The second area transport control is control in which the second area transport facility 2 is operated so that the transportation status information 90 of the second area transport facility 2 is acquired, the partial path R2 from the second transfer position 32 (the second transfer position 32 selected by the connection control unit 53 in the present embodiment) of the target connecting transport facility 3a to the destination point X2 is set on the basis of the transportation status information 90, and the target article is transported from the second transfer position 32 of the target connecting transport facility 3a to the destination point X2 along the partial path R2. In the present embodiment, with the second area transport control, control is executed to cause the second transport vehicle 42 to travel while holding the target article so that the target article is transported from the second transfer position 32 of the target connecting transport facility 3a to the destination point X2. The partial path R2 may be set in a similar manner to the overall path R1, except excluding taking into account the information (specifically, the transportation status information 90, the estimated transportation status information 91, and the weighting information 92) of the first area transport facility 1 and the connecting transport facilities 3. Note that there are cases where the partial path R2 is set on the same path as the portion of the overall path R1 between the second transfer position 32 and the destination point X2 and cases where the partial path R2 is set on a path with at least a portion different. An example of the former is illustrated in FIG. 1, and an example of the latter is illustrated in FIG. 2.

In the present embodiment, the connection control unit 53 is configured to transmit, to the second area control unit 52, estimated arrival information 93 (see FIG. 3) indicating the estimated arrival of the target article at the second transfer position 32 before the target article arrives at the second transfer position 32 via execution of the connecting transport control, and the second area control unit 52 is configured to start preparations of the second area transport control on the basis of the estimated arrival information 93. In the present embodiment, the preparations of the second area transport control includes placing the second transport vehicle 42 while not holding the transport article W at the second transfer position 32, and the second area control unit 52 controls the travel operation of the second transport vehicle 42 so that the second transport vehicle 42 is placed at the second transfer position 32 as the target article arrives at the second transfer position 32 or before.

Other Embodiments

Next, a transport system according to other embodiments will be described.

Figure 5:
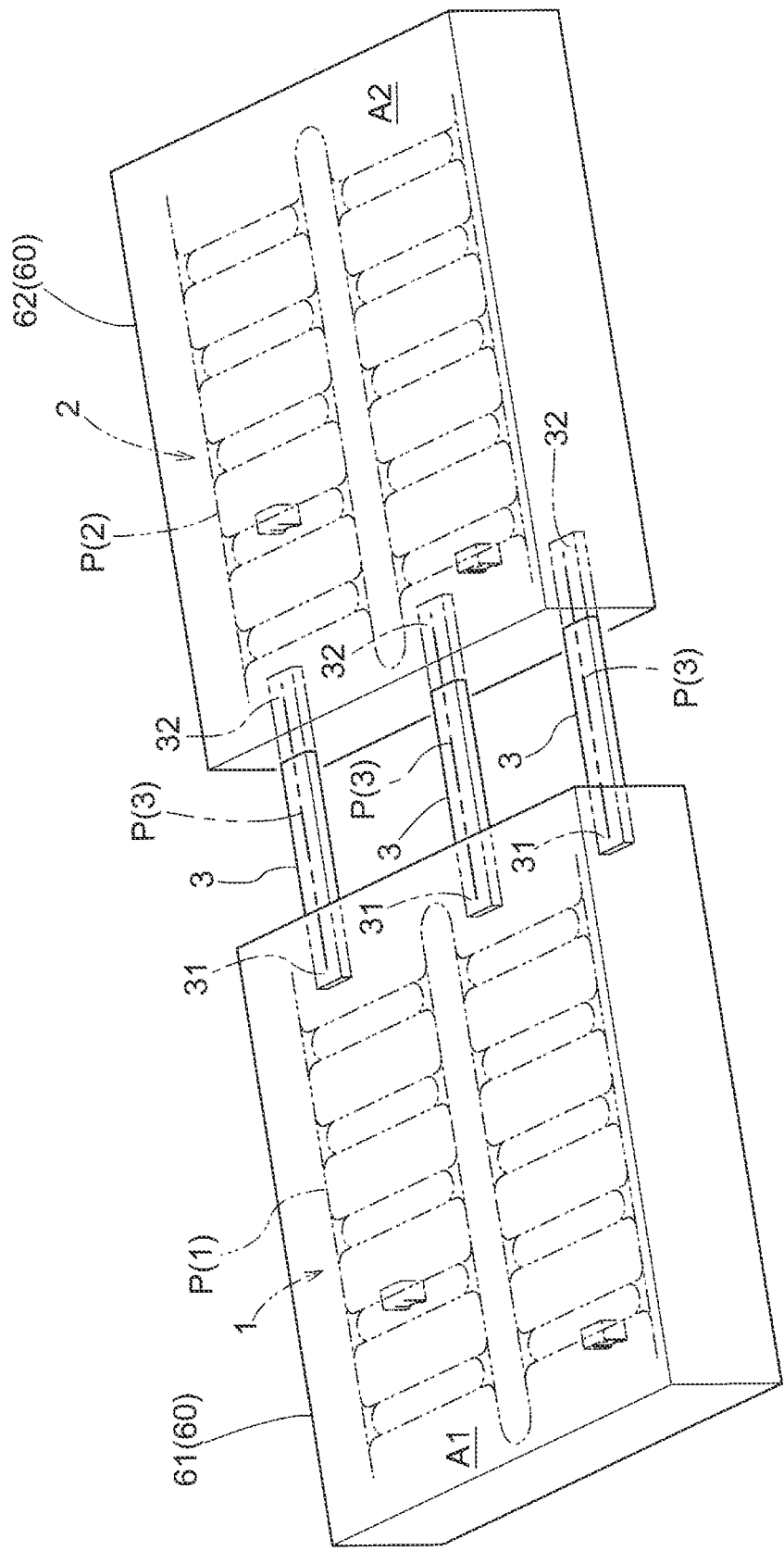
FIG. 5 is a perspective view illustrating in a simplified manner a transport facility according to another embodiment.

1. In the embodiment described above, the first area A1 and the second area A2 are separately set in the different floors 70 in the same building 60, and the connecting transport facilities 3 are inter-floor transport facilities. However, the present disclosure is not limited to this configuration, and, for example, the first area A1 and the second area A2 may be separately set in the different buildings 60, as in the example illustrated in FIG. 5. In the example illustrated in FIG. 5, the first area A1 is set in a first building 61, and the second area A2 is set in a second building 62, which is a different building 60 from the first building 61. In this case, the connecting transport facilities 3 are inter-building transport facilities for transporting the transport articles W between the different buildings 60. The inter-building transport facilities are facilities for transporting the transport articles W via a conveyor, for example.

2. In the embodiment described above, the connection control unit 53 transmits the estimated arrival information 93 to the second area control unit 52 before the target article arrived at the second transfer position 32 via execution of the connecting transport control, and the second area control unit 52 starts preparations of the second area transport control on the basis of the estimated arrival information 93. However, the present disclosure is not limited to this configuration, and, for example, the second area control unit 52 may start preparations of the second area transport control on the basis of information transmitted from the connection control unit 53 to the management control unit 50 or the second area control unit 52 as the target article arrives at the second transfer position 32 via execution of the connecting transport control.

3. In the embodiment described above, the management control unit 50 sets the overall path R1 on the basis of the estimated transportation status information 91 of the first area transport facility 1, the second area transport facility 2, and the plurality of connecting transport facilities 3. However, the present disclosure is not limited to this configuration, and the management control unit 50 may set the overall path R1 on the basis of the estimated transportation status information 91 of the first area transport facility 1 and the second area transport facility 2 without taking into account the estimated transportation status information 91 of the connecting transport facilities 3, or the management control unit 50 may set the overall path R1 without taking into account the estimated transportation status information 91 of any of the transport facilities.

4. In the embodiment described above, the management control unit 50 sets the overall path R1 on the basis of the weighting information 92 of the first area transport facility 1, the second area transport facility 2, and the plurality of connecting transport facilities 3. However, the present disclosure is not limited to this configuration, and the management control unit 50 may set the overall path R1 on the basis of the weighting information 92 of the first area transport facility 1 and the second area transport facility 2 without taking into account the weighting information 92 of the connecting transport facilities 3.

5. In the embodiment described above, the connection control unit 53 acquires the inbound/outbound transport status information 94 for each one of the plurality of second transfer positions 32 of the target connecting transport facility 3a and, on the basis of the inbound/outbound transport status information 94, selects the transportation destination of the target article for the connecting transport control from the plurality of second transfer positions 32. However, the present disclosure is not limited to this configuration, and the transportation destination of the target article for connecting transport control may be fixed as the second transfer position 32 included in the overall path R1.

6. In the embodiment described above, the connecting transport facilities 3 are provided with a plurality of the first transfer positions 31 and a plurality of the second transfer positions 32. However, the present disclosure is not limited thereto, and the connecting transport facilities 3 may be provided with a single first transfer position 31, the connecting transport facilities 3 may be provided with a single second transfer position 32, or the connecting transport facilities 3 may be provided with a combination thereof.

7. Note that the configurations described in the embodiments described above can be used in combination with configurations described in other embodiments (including combinations embodiments described as other embodiments) as long as inconsistencies are avoided. Also, regarding the other configurations, the embodiments described in the present specification are merely examples in all aspects. Accordingly, various modifications within the range of the present disclosure can be made as appropriate.

Supplement

A summary of the transport system described above will be given below.

A transport system for transporting a plurality of transport articles, comprising: a first area provided with a first area transport facility that forms a plurality of transport paths;
- a first area control unit configured to control the first area transport facility and to transport the transport articles along a path selected from the plurality of transport paths in the first area;
- a second area provided with a second area transport facility that forms a plurality of transport paths;
- a second area control unit configured to control the second area transport facility and to transport the transport articles along a path selected from the plurality of transport paths in the second area;
- a plurality of connecting transport facilities that each form a transport path connecting a first transfer position provided in the first area and a second transfer position provided in the second area;
- a connection control unit configured to control the plurality of connecting transport facilities and to transport the transport articles between the first transfer position and the second transfer position; and
- a management control unit configured to manage the first area control unit, the second area control unit, and the connection control unit, wherein one transport article from among the plurality of transport articles is defined as a target article and others are defined as other articles;
- in a case where the target article is transported between areas from a departure point in the first area to a destination point in the second area, the management control unit executes path setting control, the first area control unit executes first area transport control, the connection control unit executes connecting transport control, and the second area control unit executes second area transport control;
- the path setting control is control that includes acquiring transportation status information indicating a transportation status of the other articles for each of the first area transport facility, the second area transport facility, and the plurality of connecting transport facilities, and setting an overall path from the departure point to the destination point on the basis of the transportation status information;
- a connecting transport facility from among the plurality of connecting transport facilities that is included in the overall path is defined as a target connecting transport facility;
- the first area transport control is control in which the first area transport facility is operated to transport the target article from the departure point to the first transfer position of the target connecting transport facility;
- the connecting transport control is control in which the target connecting transport facility is operated to transport the target article from the first transfer position of the target connecting transport facility to the second transfer position; and
- the second area transport control is control in which the second area transport facility is operated so that the transportation status information of the second area transport facility is acquired, a partial path from the second transfer position of the target connecting transport facility to the destination point is set on the basis of the transportation status information, and the target article is transported from the second transfer position of the target connecting transport facility to the destination point along the partial path.

According to the present configuration, in a case where the target article is transported between areas from the departure point in the first area to the destination point in the second area, the overall path from the departure point to the destination point can be set on the basis of the transportation status information of the first area transport facility, the second area transport facility, and the plurality of connecting transport facilities. In a different configuration where the transport path of the target article in the first area with the departure point is set without taking into account the transportation status information of the second area transport facility and/or the connecting transport facilities, even if the transport path of the target article in the first area is set appropriately, the overall path from the departure point to the destination point may not be set appropriately due to, for example, the transport path of the target article in the second area with the destination point going through a congested area (high traffic area), the entire length of the transport path from the departure point to the destination point being too long, using a connecting transport facility with many of the other articles waiting for transport, or the like. In contrast, in the present configuration, the overall path can be set taking into account the transportation status information of the first area transport facility, the second area transport facility, and the plurality of connecting transport facilities. This facilitates setting an appropriate path for the overall path.

In a case where a transportation status that changes over time due to congestion or the like is taken into account, the transportation status of the other articles in the transport facility provided in an area may changed before the target article is transported in the area. Also, a change in the transportation status from when the overall path is set is likely to be more pronounced in the second area compared to the first area, because the target article is transported in the second area after. Regarding this, in the present configuration, with the second area transport control, the partial path to the destination point is set on the basis of the transportation status information of the second area transport facility, and the target article is transported along the partial path. Thus, even in a case where the transportation status of the other articles in the second area changes before the target article is transported in the second area, the transport path of the target article in the second area can be set more appropriately.

As described above, in the present configuration, in a case where the target article is transported between the first area and the second area where operation control of the transport facility is executed by different control units, the transport path of the target article in each area can be set appropriately.

Preferably, the connection control unit transmits, to the second area control unit, estimated arrival information indicating an estimated arrival of the target article at the second transfer position before the target article arrives at the second transfer position via execution of the connecting transport control; and the second area control unit starts preparations of the second area transport control on the basis of the estimated arrival information.

According to the present configuration, the time taken from when the target article arrives at the second transfer position to when the second area transport control starts with the target article can be kept short, and the transportation efficiency of the target article can be improved.

Also, preferably, the plurality of connecting transport facilities each include a plurality of the second transfer positions; and the connection control unit acquires inbound/outbound transport status information indicating an inbound/outbound transport status of the other articles for each one of the plurality of second transfer positions of the target connecting transport facility and, on the basis of the inbound/outbound transport status information, selects a transportation destination of the target article for the connecting transport control via execution of the connecting transport control from the plurality of second transfer positions.

According to the present configuration, in a case where the connecting transport facilities are provided with a plurality of the second transfer positions, the second transfer position, i.e., the target article transportation destination, can be selected taking into account the inbound/outbound transport status information of each one of the second transfer positions. Thus, the transfer efficiency of the target article from the second transfer position to the second area transport facility can be improved.

Also, preferably, with the path setting control, weighting information indicating a weighting of each transport path for the first area transport facility and the second area transport facility is further acquired, and the overall path is set also on the basis of the weighting information.

According to the present configuration, in a case where there are a plurality of candidates for the overall path, the overall path can be appropriately set via quantitative comparison on the basis of the weighting of the candidate paths. For example, in a case where the weighting is set depending on the length of the transport paths, the average required transportation time, the average congestion rate, or the like, the overall path can be set so that the time required to arrive at the destination point is the shortest average time.

As described above, with the path setting control configured so that the overall path is set on the basis of the weighting information of the first area transport facility and the second area transport facility, preferably, with the path setting control, the weighting information of each one of the plurality of connecting transport facilities is further acquired and the overall path is set also on the basis of the weighting information.

According to the present configuration, by taking into account the weighting information of each one of the connecting transport facilities in addition to the weighting information of the first area transport facility and the second area transport facility, the overall path can be set more appropriately.

In the transport system of the configurations described above, preferably, with the path setting control, estimated transportation status information indicating a future transportation status of the other articles estimated on the basis of previous information of the transportation status information for the first area transport facility and the second area transport facility is further acquired, and the overall path is set also on the basis of the estimated transportation status information.

According to the present configuration, the overall path can be set taking into account the estimated transportation status information of the first area transport facility and the second area transport facility. Thus, the overall path can be set more appropriately. Accordingly, the overall path can be set utilizing previous transportation status information to, for example, minimize interference with the other articles or unnecessary detours around congested areas.

As described above, with the path setting control configured so that the overall path is set on the basis of the estimated transportation status information of the first area transport facility and the second area transport facility, preferably, with the path setting control, the estimated transportation status information of each one of the plurality of connecting transport facilities is further acquired and the overall path is set also on the basis of the estimated transportation status information.

According to the present configuration, by taking into account the estimated transportation status information of each one of the connecting transport facilities in addition to the estimated transportation status information of the first area transport facility and the second area transport facility, the overall path can be set more appropriately.

In the transport system of the configurations described above, preferably, with the path setting control, a path with a lowest estimated value for time required to transport the target article from the departure point to the destination point is set as the overall path.

According to the present configuration, the likelihood of setting the overall path to a path with the shorted transport time from the departure point to the destination point can be increased.

Also, preferably, the first area and the second area are separately set in different floors in the same building; and the connecting transport facilities are inter-floor transport facilities for transporting the transport articles between different floors in the same building.

As described above, in the transport system of the present disclosure, in a case where the target article is transported between the first area and the second area where operation control of the transport facility is executed by different control units, the transport path of the target article in each area can be set appropriately. Thus, in a case such as the present configuration where the connecting transport facilities are inter-floor transport facilities, the transport path of the target article on each floor can be appropriately set.

Also, preferably, the first area and the second area are separately set in different buildings; and the connecting transport facilities are inter-building transport facilities for transporting the transport articles between different buildings.

As described above, in the transport system of the present disclosure, in a case where the target article is transported between the first area and the second area where operation control of the transport facility is executed by different control units, the transport path of the target article in each area can be set appropriately. Thus, in a case such as the present configuration where the connecting transport facilities are inter-building transport facilities, the transport path of the target article in each building can be appropriately set.

The transport system according to the present disclosure is only required to achieve at least one of the effects described above.

What is claimed is:

1. A transport system for transporting a plurality of transport articles, comprising:
   a first area provided with a first area transport facility that forms a plurality of transport paths;
   a first area control unit configured to control the first area transport facility and to transport the transport articles along a path selected from the plurality of transport paths in the first area;
   a second area provided with a second area transport facility that forms a plurality of transport paths;
   a second area control unit configured to control the second area transport facility and to transport the transport articles along a path selected from the plurality of transport paths in the second area;
   a plurality of connecting transport facilities that each form a transport path connecting a first transfer position provided in the first area and a second transfer position provided in the second area;
   a connection control unit configured to control the plurality of connecting transport facilities and to transport the transport articles between the first transfer position and the second transfer position; and
   a management control unit configured to manage the first area control unit, the second area control unit, and the connection control unit,
   wherein:
   one transport article from among the plurality of transport articles is a target article and others are other articles;
   in a case where the target article is transported between areas from a departure point in the first area to a destination point in the second area, the management control unit executes path setting control, the first area control unit executes first area transport control, the connection control unit executes connecting transport control, and the second area control unit executes second area transport control;
   the path setting control is control that includes acquiring transportation status information indicating a transportation status of the other articles for each of the first area transport facility, the second area transport facility, and the plurality of connecting transport facilities, and setting an overall path from the departure point to the destination point on the basis of the transportation status information;
   a connecting transport facility from among the plurality of connecting transport facilities that is included in the overall path is a target connecting transport facility;
   the first area transport control is control in which the first area transport facility is operated to transport the target article from the departure point to the first transfer position of the target connecting transport facility;
   the connecting transport control is control in which the target connecting transport facility is operated to transport the target article from the first transfer position of the target connecting transport facility to the second transfer position; and
   the second area transport control is control in which the second area transport facility is operated so that the transportation status information of the second area transport facility is acquired, a partial path from the second transfer position of the target connecting transport facility to the destination point is set on the basis of the transportation status information, and the target article is transported from the second transfer position of the target connecting transport facility to the destination point along the partial path.

2. The transport system according to claim 1, wherein:
   the connection control unit transmits, to the second area control unit, estimated arrival information indicating an estimated arrival of the target article at the second transfer position before the target article arrives at the second transfer position via execution of the connecting transport control; and
   the second area control unit starts preparations of the second area transport control on the basis of the estimated arrival information.

3. The transport system according to claim 1, wherein:
   the plurality of connecting transport facilities each include a plurality of the second transfer positions; and
   the connection control unit acquires inbound/outbound transport status information indicating an inbound/outbound transport status of the other articles for each one of the plurality of second transfer positions of the target connecting transport facility and, on the basis of the inbound/outbound transport status information, selects a transportation destination of the target article for the connecting transport control via execution of the connecting transport control from the plurality of second transfer positions.

4. The transport system according to claim 1, wherein:
   with the path setting control, weighting information indicating a weighting of each transport path for the first area transport facility and the second area transport facility is further acquired, and the overall path is set also on the basis of the weighting information.

5. The transport system according to claim 4, wherein:
   with the path setting control, the weighting information for each one of the plurality of connecting transport facilities is further acquired, and the overall path is set also on the basis of the weighting information.

6. The transport system according to claim 1, wherein:
   with the path setting control, estimated transportation status information indicating a future transportation status of the other articles estimated on the basis of previous information of the transportation status information for the first area transport facility and the second area transport facility is further acquired, and the overall path is set also on the basis of the estimated transportation status information.

7. The transport system according to claim 6, wherein:
   with the path setting control, the estimated transportation status information for each one of the plurality of connecting transport facilities is further acquired, and the overall path is set also on the basis of the estimated transportation status information.

8. The transport system according to claim 1, wherein:
   with the path setting control, a path with a lowest estimated value for time required to transport the target article from the departure point to the destination point is set as the overall path.

9. The transport system according to claim 1, wherein:
   the first area and the second area are separately set in different floors in the same building; and
   the connecting transport facilities are inter-floor transport facilities for transporting the transport articles between different floors in the same building.

10. The transport system according to claim 1, wherein:
    the first area and the second area are separately set in different buildings; and
    the connecting transport facilities are inter-building transport facilities for transporting the transport articles between different buildings.

* * * * *